(12) United States Patent
Hu et al.

(10) Patent No.: US 8,709,842 B2
(45) Date of Patent: Apr. 29, 2014

(54) LIGHT-EMITTING DIODE PACKAGE AND METHOD FOR MANUFACTURING THE SAME

(75) Inventors: Pi-Chiang Hu, Hsinchu (TW); Shih-Yuan Hsu, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/476,038

(22) Filed: May 21, 2012

(65) Prior Publication Data
US 2013/0026520 A1 Jan. 31, 2013

(30) Foreign Application Priority Data
Jul. 27, 2011 (CN) .......................... 2011 1 0211906

(51) Int. Cl.
*H01L 33/44* (2010.01)
(52) U.S. Cl.
USPC .. 438/27; 257/98; 257/E33.056; 257/E33.061
(58) Field of Classification Search
USPC ................ 257/98, E33.056, E33.061; 438/27
See application file for complete search history.

(56) References Cited

U.S. PATENT DOCUMENTS

| 2004/0041220 A1* | 3/2004 | Kwak et al. .................... 257/432 |
| 2009/0273004 A1* | 11/2009 | Lin et al. .......................... 257/99 |
| 2012/0001214 A1* | 1/2012 | Ooyabu et al. .................. 257/98 |

* cited by examiner

*Primary Examiner* — Marc Armand
(74) *Attorney, Agent, or Firm* — Novak Druce Connolly Bove + Quigg LLP

(57) ABSTRACT

An LED package includes a substrate, an LED chip arranged on the substrate, and a light transmission layer arranged on a light output path of the LED chip. The substrate includes a first electrode and a second electrode separated and electrically insulated from the first electrode. The LED chip is electrically connected to the first electrode and the second electrode of the substrate. The light transmission layer comprises two parallel transparent plates and a fluorescent layer sandwiched between the two transparent plates. The LED package further includes a transparent encapsulation layer sealing the LED chip therein, and in one embodiment, the light transmission layer is located on the encapsulation layer and in another embodiment, the encapsulation layer also seals the light transmission layer therein. A method for manufacturing the LED package is also provided.

10 Claims, 14 Drawing Sheets

LIGHT-EMITTING DIODE PACKAGE AND METHOD FOR MANUFACTURING THE SAME

BACKGROUND

1. Technical Field

The present disclosure relates to a light-emitting diode (LED) package and a method for manufacturing the LED package.

2. Description of Related Art

LEDs have been widely promoted as a light source of electronic devices owing to many advantages, such as high luminosity, low operational voltage and low power consumption. In practice, the LED chip is generally packaged to protect the LED chip, and the fluorescent layer is formed on the LED chip by coating. However, during the coating of the packaging process, a thickness of the fluorescent layer cannot be controlled precisely, whereby a uniform light output cannot obtained, which unfavorably affects the quality of light generated by the LED package.

Therefore, an LED package and a method for manufacturing the LED package capable of overcoming the above described shortcoming is desired.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiment of the present LED package and the method for making the LED package will now be described in detail below and with reference to the drawings.

Figure 1:
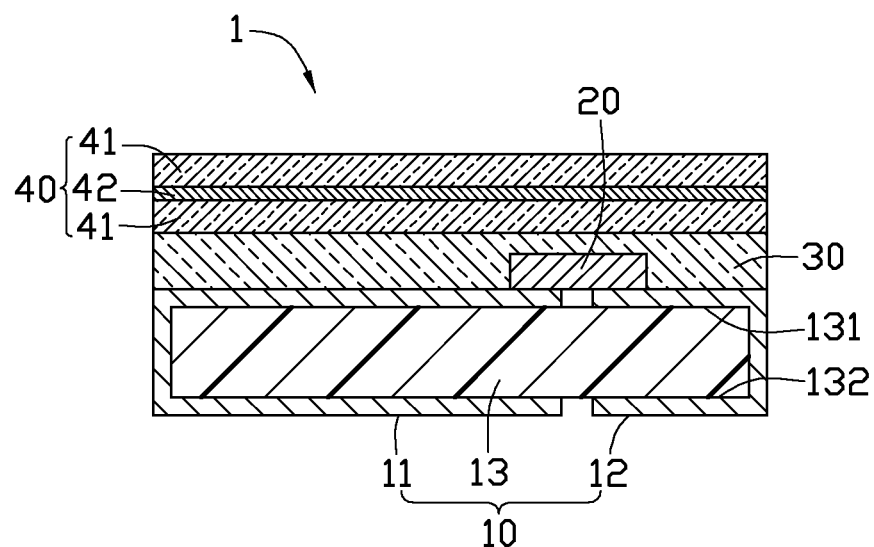
FIG. 1 is a schematic, cross-sectional view of an LED package in accordance with a first embodiment of the present disclosure.

Referring to FIG. 1, an LED package 1 in accordance with a first embodiment of the present disclosure includes a substrate 10, an LED chip 20, an encapsulation layer 30 and a light transmission layer 40.

The substrate 10 includes a plate 13, a first electrode 11 and a second electrode 12 separated and electrically insulated from the first electrode 11. The first electrode 11 and the second electrode 12 are located on opposite sides of the plate 13, respectively.

The plate 13 is made of an electrically insulated material with high heat conductivity, such as ceramic or silicon. In this embodiment, the plate 13 is flat, and includes a top surface 131 and a bottom surface 132 opposite to the top surface 131. The first electrode 11 and the second electrode 12 each extend from the top surface 131 to the bottom surface 132 and traverse an outer periphery side surface of the plate 13. The first electrode 11 and the second electrode 12 are made of metallic material with high electrical conductivity, such as gold, silver, platinum, copper, aluminum, nickel, tin, magnesium or an alloy thereof.

The LED chip 20 is located on the substrate 10. In this embodiment, the LED chip 20 is electrically connected to the first electrode 11 and the second electrode 12 by flip-chip. Specifically, the LED chip 20 is located on the first electrode 11 and the second electrode 12, and directly contacts the first electrode 11 and the second electrode 12. Alternatively, the LED chip 20 can also be electrically connected to the first electrode 11 and the second electrode 12 by metal wires.

The encapsulation layer 30 is located on the substrate 10 and seals the LED chip 20 therein. In this embodiment, the encapsulation layer 30 is flat and transparent.

The light transmission layer 40 is arranged on a light output path of the LED chip 20. In this embodiment, the light transmission layer 40 is located on the encapsulation layer 30, and an outer periphery of the light transmission layer 40 is aligned with that of the encapsulation layer 30. The light transmission layer 40 includes two parallel transparent plates 41 and a fluorescent layer 42 sandwiched between the two transparent plates 41. A length of the transparent plate 41 is equal to that of the fluorescent layer 42, and a thickness of the transparent plate 41 is greater than that of the fluorescent layer 42. In this embodiment, the thickness of the fluorescent layer 42 is less than 100 um. The transparent plate 41 is a transparent ceramic plate. Alternatively, the transparent plate 41 can also be made of other hard and transparent material.

Because the light transmission layer 40 which is located on the LED chip 20 includes the two parallel transparent plates 41 and the fluorescent layer 42 sandwiched therebetween, and the thickness of the fluorescent layer 42 is kept uniform, the light emitting from the LED package 1 is uniform.

The LED package 1 described above can be manufactured in following steps.

Figure 2:
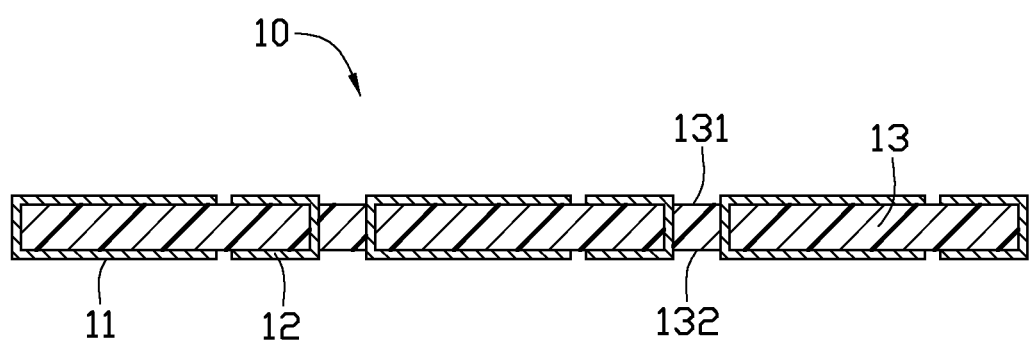
FIGS. 2-7 show steps of a method for manufacturing the LED package of FIG. 1.

As shown in FIG. 2, an elongated substrate 10 is provided. The substrate 10 includes a plate 13 and a number of pairs of first electrodes 11 and second electrodes 12. Each of the second electrodes 12 is separated and electrically insulated from the corresponding one of the first electrodes 11, and the pairs of first electrodes 11 and second electrodes 12 are equidistantly located at different regions of the plate 13. The plate 13 is made of an electrically insulated material with high heat conductivity, such as ceramic or silicon. In this embodiment, the plate 13 is flat, and includes a top surface 131 and a bottom surface 132 opposite to the top surface 131. Each of the first electrode 11 and the second electrode 12 respectively extends from the top surface 131 and traverses downwardly through the plate 13 to reach the bottom surface 132. The first electrode 11 and the second electrode 12 are made of metallic material with high electrical conductivity, such as gold, silver, platinum, copper, aluminum, nickel, tin, magnesium or an alloy thereof.

Figure 3:
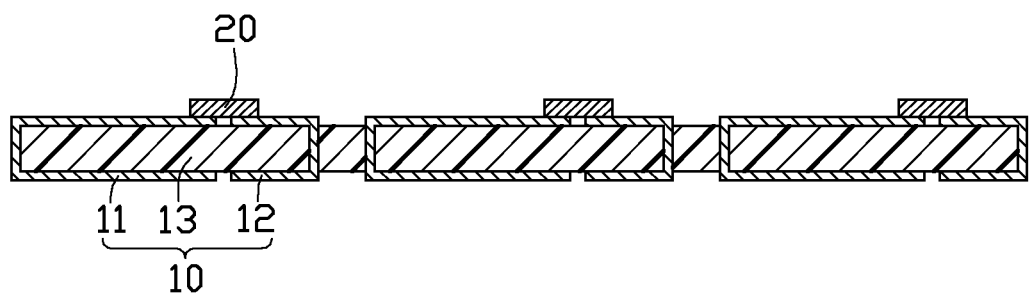

As shown in FIG. 3, a plurality of LED chips 20 are provided on the substrate 10. Each of the LED chips 20 is electrically connected to the corresponding first electrode 11 and the corresponding second electrode 12. In this embodiment, the LED chips 20 are located over the plate 13, and each LED chip 40 is electrically connected to the corresponding first electrode 11 and the corresponding second electrode 12 by flip-chip. Alternatively, the LED chip 20 can also be electrically connected to the first electrode 11 and the second electrode 12 by metal wires.

Figure 4:
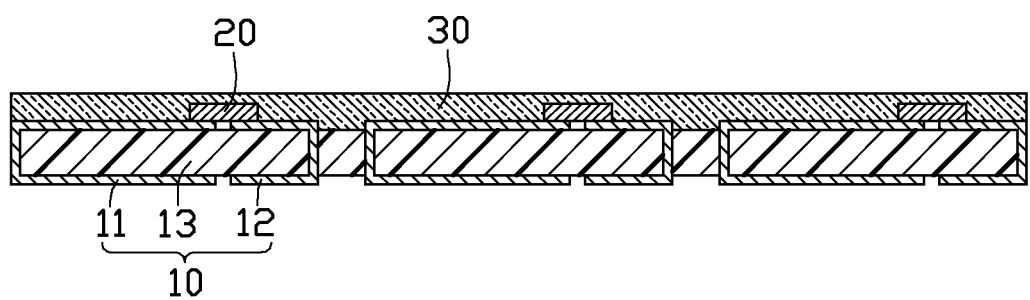

As shown in FIG. 4, an encapsulation layer 30 is provided to cover the top surface 131 of the plate 13, the first electrodes 11 and second electrodes 12 and the LED chips 20. The encapsulation layer 30 seals the LED chips 20 therein. In this embodiment, the encapsulation layer 30 is flat and made of transparent material such as transparent resin.

Figure 5:

As shown in FIG. 5, a light transmission layer 40 is provided to be secured on a top surface of the encapsulation layer 30 whereby the light transmission layer 40 is located on a light output path of each LED chip 20. The light transmission layer 40 includes two parallel transparent plates 41 and a fluorescent layer 42 sandwiched therebetween. A length of the transparent plate 41 is equal to that of the fluorescent layer 42, and a thickness of the transparent plate 41 is greater than that of the fluorescent layer 42. In this embodiment, the thickness of the fluorescent layer 42 is less than 100 um. The transparent plate 41 is a transparent ceramic plate. Alternatively, the transparent plate 41 can also be made of other hard and transparent material.

Figure 6:
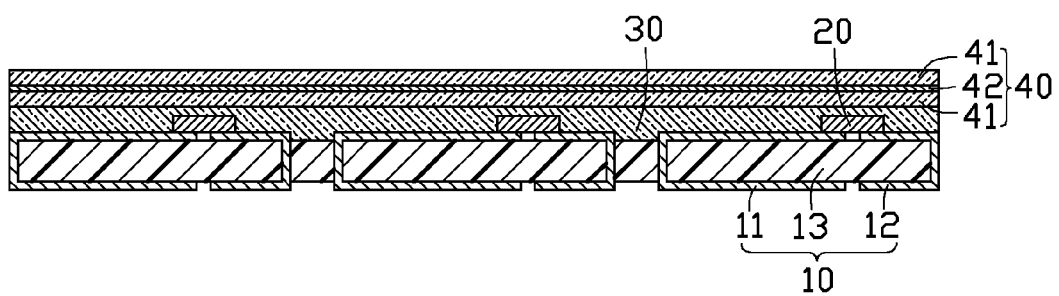

As shown in FIG. 6, the light transmission layer 40 is set on the encapsulation layer 30, and an outer periphery of the light transmission layer 40 is aligned with that of the encapsulation layer 30. A lithography may be used to form an optical pattern on a top surface of the upper transparent plate 41 to obtain a required optical effectiveness if necessary.

Figure 7:
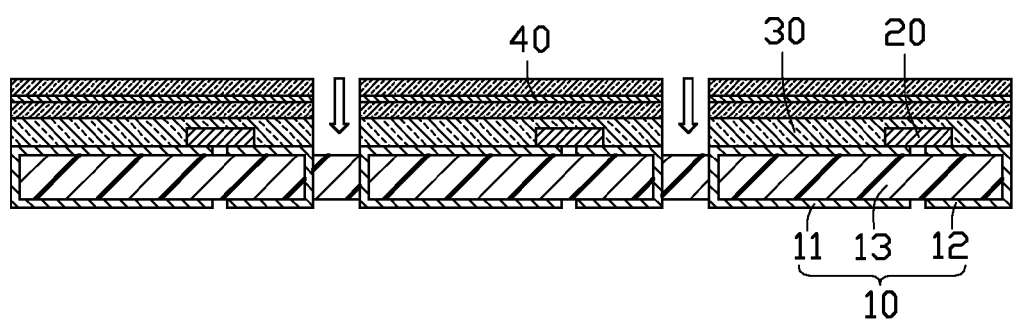

As shown in FIG. 7, the encapsulation layer 30 and the light transmission layer 40 between the adjacent LED chips 20 are processed by etching to be removed; successively the substrate 10 below the voids of the encapsulation layer 30 and light transmission layer 40 formed by the etching are cut away. Then, a plurality of separated LED packages 1 as shown in FIG. 1 are formed. Each LED package 1 includes a portion of the substrate 10 with one first electrode 11 and one second electrode 12, one LED chip 20, one encapsulation layer 30 and one light transmission layer 40.

In comparison with a conventional LED package, because the LED package 1 in accordance with the present disclosure includes the light transmission layer 40 with the two parallel transparent plates 41 and the fluorescent layer 42 sandwiched therebetween, the thickness of the fluorescent layer 42 is uniform, and the output light of the LED package 1 is uniform.

Figure 8:
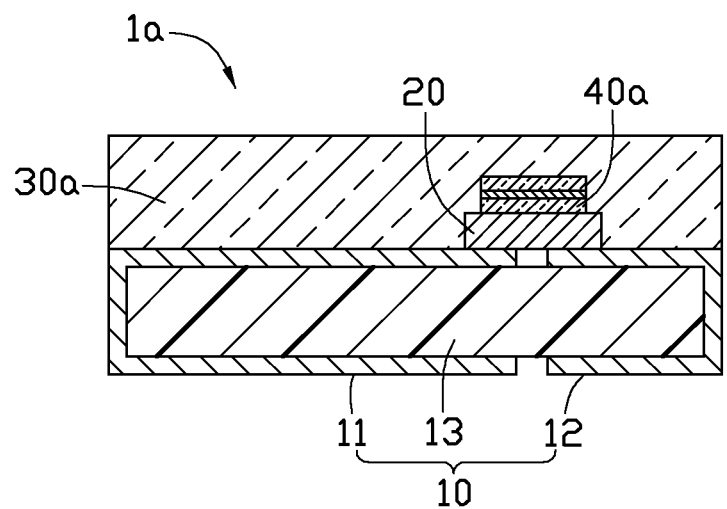
FIG. 8 is a schematic, cross-sectional view of an LED package in accordance with a second embodiment of the present disclosure.

As shown in FIG. 8, an LED package 1a according to a second embodiment is provided. Differing from the LED package 1 of the first embodiment, a light transmission layer 40a is directly located on a top surface of the LED chip 20, and a length of the light transmission layer 40a is less than that of the LED chip 20. An encapsulation layer 30a is located on the first electrode 11 and the second electrode 12, and seals the LED chip 20 and the light transmission layer 40a therein.

The LED package 1a described above can be manufactured in following steps.

Figure 9:
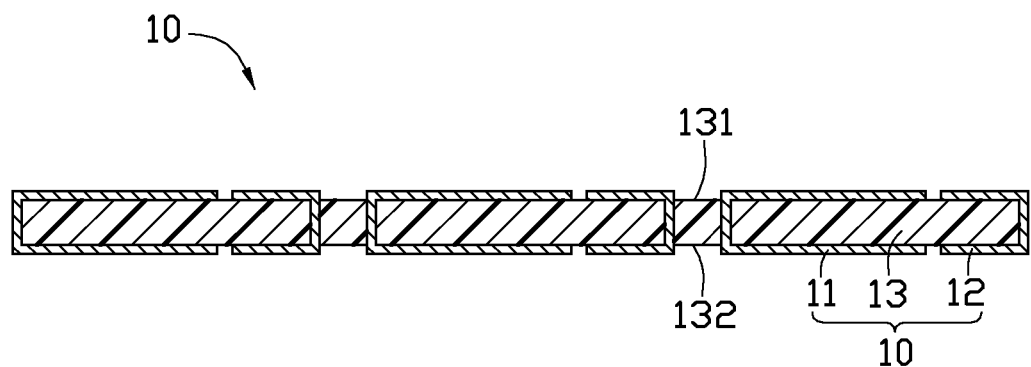
FIGS. 9-14 show steps of a method for manufacturing the LED package of FIG. 8.

As shown in FIG. 9, an elongated substrate 10 is provided. The substrate 10 includes a plate 13 and a number of pairs of first electrodes 11 and second electrodes 12. Each of the second electrodes 12 is separated and electrically insulated from the corresponding one of the first electrodes 11, and the pairs of first electrodes 11 and second electrodes 12 are equidistantly located at different regions of the plate 13. The plate 13 is made of an electrically insulated material with high heat conductivity, such as ceramic or silicon. In this embodiment, the plate 13 is flat, and includes a top surface 131 and a bottom surface 132 opposite to the top surface 131. Each of the first electrode 11 and the second electrode 12 respectively extends from the top surface 131 and traverses downwardly through the plate 13 to reach the bottom surface 132. The first electrode 11 and the second electrode 12 are made of metallic material with high electrical conductivity, such as gold, silver, platinum, copper, aluminum, nickel, tin, magnesium or combination thereof.

Figure 10:
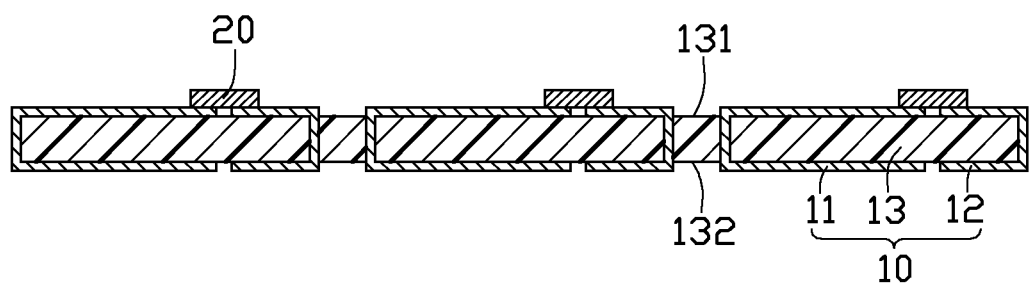

As shown in FIG. 10, a plurality of LED chips 20 are provided on the substrate 10. Each of the LED chips 20 is electrically connected to the corresponding first electrode 11 and the corresponding second electrode 12. In this embodiment, the LED chips 20 are located over the plate 13, and each LED chip 40 is electrically connected to the corresponding first electrode 11 and the corresponding second electrode 12 by flip-chip. Alternatively embodiment, the LED chip 20 can also be electrically connected to the first electrode 11 and the second electrode 12 by metal wires.

Figure 11:
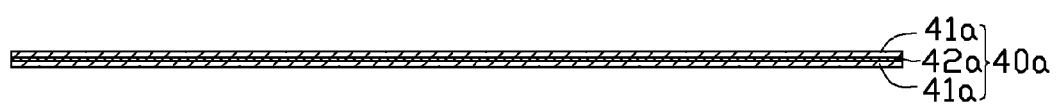

As shown in FIG. 11, a light transmission layer 40a is provided. The light transmission layer 40a includes two parallel transparent plates 41a and a fluorescent layer 42a sandwiched therebetween. A length of the transparent plate 41a is equal to that of the fluorescent layer 42a, and a thickness of the transparent plate 41a is greater than that of the fluorescent layer 42a. In this embodiment, the thickness of the fluorescent layer 42 is less than 100 um. The transparent plate 41 is a transparent ceramic plate. Alternatively, the transparent plate 41 can be made of other hard and transparent material.

Figure 12:
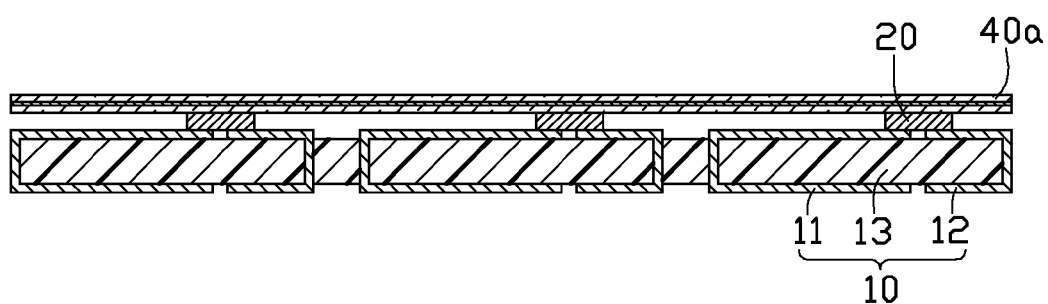

As shown in FIG. 12, the light transmission layer 40a is directly arranged on the LED chips 20 whereby the light transmission layer 40a covers a light output path of each LED chip 20.

Figure 13:
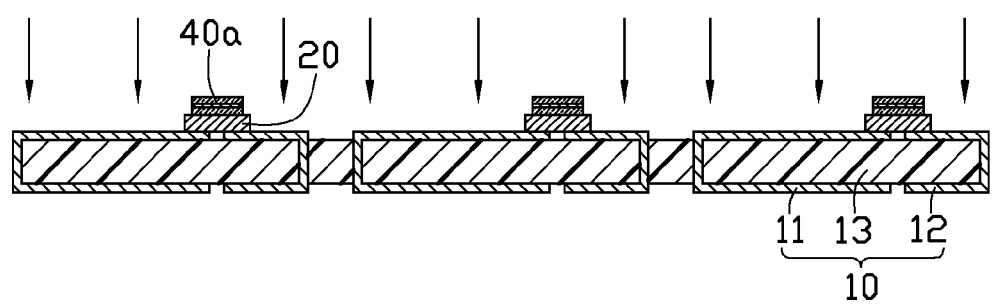

As shown in FIG. 13, the light transmission layer 40a is formed on each LED chip 20 and spaced from each other by etching.

Figure 14:
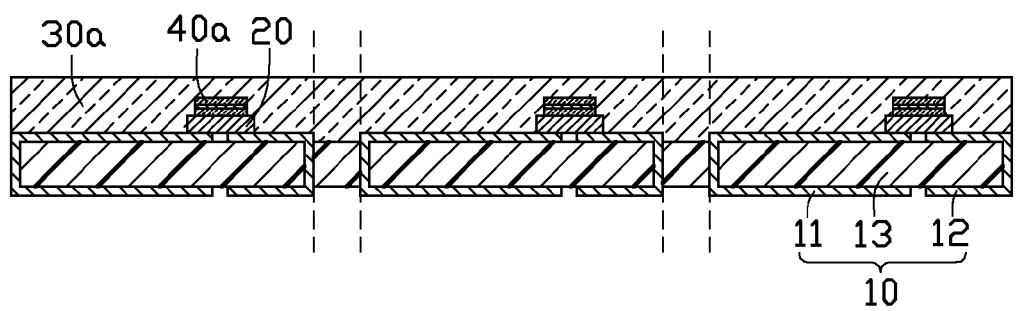

As shown in FIG. 14, an encapsulation layer 30a is provided to cover the top surface of the substrate 10 and seals the LED chips 20 and the light transmission layer 40a therein. In this embodiment, the encapsulation layer 30a is flat, and a length of the encapsulation layer 30a is equal to that of the substrate 10. Then, the encapsulation layer 30a and the substrate 10 are cut into a plurality of separated LED packages 1a as shown in FIG. 8. Each of the LED packages 1a includes a portion of the substrate 10 with one first electrode 11 and one second electrode 12, one LED chip 20, one encapsulation layer 30a and one light transmission layer 40a.

In comparison with a conventional LED package, due to that the LED package 1a in accordance with the present disclosure includes the light transmission layer 40 with the two parallel transparent plates 41a and the fluorescent layer 42a sandwiched therebetween, the thickness of the fluorescent layer 42a is thereby kept uniform, and the output light of the LED package 1a is uniform.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A method for manufacturing an LED package, comprising steps of:

providing a substrate, the substrate comprising a plate and a plurality of pairs of first electrodes and second electrodes, each of the first electrodes being separated and electrically insulated from a corresponding second electrode;

arranging a plurality of LED chips on the substrate, each of the LED chips being electrically connected to a corresponding one of the first electrodes and a corresponding one of the second electrodes;

forming an encapsulation layer on the substrate to seal the LED chips therein;

providing a light transmission layer on a light output path of each LED chip, the light transmission layer comprising two parallel transparent plates and a fluorescent layer sandwiched between the two transparent plates; and processing the light transmission layer between the adjacent LED chips by etching, and cutting the substrate between the adjacent LED chips to obtain a plurality of separated LED packages;

wherein the light transmission layer is directly located on a top surface of each LED chip, and the encapsulation layer also seals the light transmission layer therein.

2. The method of claim 1, wherein each LED chip is electrically connected to the corresponding one of the first electrodes and the corresponding one of the second electrodes by flip-chip.

3. The method of claim 1, wherein a thickness of each of the transparent plates is greater than that of the fluorescent layer.

4. The method of claim 1, wherein a thickness of the fluorescent layer is less than 100 um.

5. The method of claim 1, wherein each of the transparent plates is a transparent ceramic plate.

6. The method of claim 1, wherein the plate is made of an electrically insulated and thermally conductive material.

7. The method of claim 1, wherein the encapsulation layer is transparent.

8. The method of claim 1, wherein a length of the light transmission layer is less than that of the LED chip.

9. The method of claim 7, wherein the encapsulation layer is made of transparent resin.

10. The method of claim 8, wherein a length of the transparent plate is equal to that of the fluorescent layer.

* * * * *